(12) United States Patent
Kadota et al.

(10) Patent No.: US 9,357,653 B2
(45) Date of Patent: May 31, 2016

(54) INVERTING HEAD

(75) Inventors: Syozo Kadota, Yamanashi (JP); Akira Yamada, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 146 days.

(21) Appl. No.: 13/995,252

(22) PCT Filed: Sep. 11, 2012

(86) PCT No.: PCT/JP2012/005771
§ 371 (c)(1),
(2), (4) Date: Jun. 18, 2013

(87) PCT Pub. No.: WO2013/069184
PCT Pub. Date: May 16, 2013

(65) Prior Publication Data
US 2013/0269179 A1  Oct. 17, 2013

(30) Foreign Application Priority Data

Nov. 8, 2011 (JP) ................................. 2011-244232

(51) Int. Cl.
*H05K 13/04* (2006.01)
*H05K 3/30* (2006.01)
*H01L 23/00* (2006.01)

(52) U.S. Cl.
CPC *H05K 3/30* (2013.01); *H01L 24/75* (2013.01); *H05K 13/0408* (2013.01); *H01L 2224/7565* (2013.01); *Y10T 29/53174* (2015.01)

(58) Field of Classification Search
CPC ...................... Y10T 29/53191; H05K 13/0408

USPC ............................................ 29/729, 739–760
See application file for complete search history.

(56) References Cited

U.S. PATENT DOCUMENTS

| | | | | |
|---|---|---|---|---|
| 4,458,412 A | * | 7/1984 | Dean ................... | H05K 13/0452 156/378 |
| 5,086,559 A | * | 2/1992 | Akatsuchi ............. | B23P 19/105 228/180.21 |
| 5,588,195 A | * | 12/1996 | Asai .................... | H05K 13/0413 29/33 M |
| 5,839,187 A | * | 11/1998 | Sato ................... | H01L 21/67144 29/743 |

(Continued)

FOREIGN PATENT DOCUMENTS

| | | |
|---|---|---|
| CN | 101794718 A | 8/2010 |
| EP | 0829903 A2 | 3/1998 |

(Continued)

OTHER PUBLICATIONS

International Search Report for PCT/JP2012/005771 dated Dec. 11, 2012.

(Continued)

*Primary Examiner* — Peter DungBa Vo
*Assistant Examiner* — Kaying Kue
(74) *Attorney, Agent, or Firm* — Pearne & Gordon LLP (57) ABSTRACT

A nozzle holder 34 includes a nozzle base 51 whose both ends are supported, the nozzle base 51 inside which a vacuum path is formed, extending in a horizontal direction, a nozzle locking member 53 for communicating a nozzle 20a to the vacuum path (vacuum path 72 of the inside of the nozzle base) of the inside of the nozzle base 51, and a pair of fixing members 54 for fixing the nozzle locking member 53 to the nozzle base 51.

3 Claims, 10 Drawing Sheets

(56) References Cited

U.S. PATENT DOCUMENTS

| | | | |
|---|---|---|---|
| 7,353,596 B2* | 4/2008 | Shida | H01L 21/67144 228/180.22 |
| 7,669,317 B2* | 3/2010 | Makino | H01L 21/67144 156/249 |
| 7,827,677 B2* | 11/2010 | Ueno | H01L 21/67144 29/739 |
| 2001/0001469 A1 | 5/2001 | Higashi et al. | |
| 2002/0192059 A1* | 12/2002 | Foster, Jr. | H01L 21/67132 414/403 |
| 2005/0071989 A1* | 4/2005 | Nishiyama | H01L 25/50 29/739 |
| 2006/0104754 A1* | 5/2006 | Narita | H05K 13/0413 414/226.04 |
| 2010/0172736 A1 | 7/2010 | Takanami | |
| 2011/0289772 A1* | 12/2011 | Kosaka | H05K 13/0452 29/832 |

FOREIGN PATENT DOCUMENTS

| | | |
|---|---|---|
| JP | 2000-68327 A | 3/2000 |
| JP | 2002-329752 A | 11/2002 |
| JP | 2005-347321 A | 12/2005 |
| WO | 2004/051731 A1 | 6/2004 |

OTHER PUBLICATIONS

Office Action for Chinese Application No. 201280004461.5, Dated Oct. 9, 2015.

* cited by examiner

FIG. 10

INVERTING HEAD

TECHNICAL FIELD

The present invention relates to an inverting head which is included in a component mounting apparatus for mounting a component on a substrate by a mounting head and vertically inverts the component and passes the component to the mounting head.

BACKGROUND ART

Some component mounting apparatuses for mounting a component on a substrate by a mounting head include an apparatus constructed so that a component vertically inverted by an inverting head is received by the mounting head and is mounted on a substrate and, for example, a liquid crystal panel manufacturing apparatus for mounting a component such as a driving circuit in a peripheral region of a liquid crystal panel is known. In the inverting head included by such a component mounting apparatus, normally, a nozzle is attached to the lower end of a shaft-shaped member extending vertically, and a mechanism for performing swing around the vertical axis and vertical movement of the shaft-shaped member to which the nozzle is attached is attached to the periphery of the shaft-shaped member so that swing around the vertical axis and upward and downward movement of a component sucked by the nozzle can be performed (for example, Patent Reference 1).

Also, some component mounting apparatuses described above include a type of apparatus in which a mounting head is spatially fixed and formed in order to eliminate a positioning error occurring at the time of movement of the mounting head and a substrate is moved so as to position an electrode part on the substrate of a component mounting target site under this mounting head spatially fixed and formed and an inverting head is moved so as to position an vertically inverted component over the component mounting target site (that is, under the mounting head). In this type of apparatus, the inverting head enters the inside of a region between the substrate and the mounting head and passes the vertically inverted component to the mounting head and after the inverting head retracts from the upper side of the component mounting target site, the mounting head receiving the component downwardly moves the component and mounts the component at the component mounting target site. In this case, instead of the configuration described above, the inverting head can also be configured to attach a nozzle holder support member swingable in a horizontal plane to a flat plate-shaped basal part formed on an upward and downward movable member and rotatably support both ends of a nozzle holder extending in a horizontal direction in the nozzle holder support member and hold a nozzle in a side surface of the nozzle holder.

PRIOR ART REFERENCE

Patent Reference

Patent Reference 1: JP-A-2000-68327

DISCLOSURE OF THE INVENTIONS

Problems that the Invention is to Solve

However, when the inverting head is configured as described above, the nozzle holder is configured to include a nozzle base formed so as to extend in a horizontal direction, the nozzle base inside which a vacuum path is formed, and a nozzle locking member for locking a nozzle in a side surface of the nozzle base and communicating the nozzle to the vacuum path of the inside of the nozzle base, and the nozzle locking member must be attached to the nozzle base by a screw, but in the case of considering dimensions necessary to sufficiently screw the screw into the nozzle base, the nozzle base itself becomes thick and accordingly, a downward movement stroke of the component at the time when the mounting head mounts the component on the substrate becomes long and a problem of causing upsizing of the whole apparatus occurs.

Hence, an object of the invention is to provide an inverting head capable of improving mounting accuracy of a component while achieving downsizing of the whole component mounting apparatus by shortening a downward movement stroke of the component at the time when a mounting head mounts the component on a substrate in the component mounting apparatus.

Means for Solving the Problems

An inverting head of the invention is the inverting head which is included in a component mounting apparatus for mounting a component on a substrate by a mounting head and sucks the component supplied in a component supply position from above by a nozzle and vertically inverts the component and moves the vertically inverted component over a component mounting target site on the substrate and passes the component to the mounting head, and includes a nozzle holder whose both ends are supported, the nozzle holder which extends in a horizontal direction and is rotatable around a horizontal axis and also holds the nozzle on a side surface, and a rotation driving part for rotating the nozzle holder around the horizontal axis and vertically switching a direction of the nozzle, and the nozzle holder includes a nozzle base whose both ends are supported, the nozzle base inside which a vacuum path is formed, extending in the horizontal direction, a nozzle locking member for locking the nozzle in the side surface of the nozzle base and communicating the nozzle to the vacuum path of the inside of the nozzle base, and a pair of fixing members which is slid and mounted on both ends of the nozzle base from the outsides of both ends of the nozzle base and fixes the nozzle locking member to the nozzle base.

Advantage of the Invention

The invention has a configuration in which the nozzle locking member for locking the nozzle in the side surface of the nozzle base and communicating the nozzle to the vacuum path of the inside of the nozzle base is fixed to the nozzle base by the pair of fixing members mounted on both ends of the nozzle base from the outsides of both ends of the nozzle base, and attachment of the nozzle locking member to the nozzle base does not require a screw so that it is unnecessary to consider the dimensions necessary to screw the screw. Accordingly, the dimension of the nozzle base in a height direction can be decreased, so that a distance between the substrate and the mounting head necessary to prevent the inverting head from interfering with both of the substrate and the mounting head in the case of moving the vertically inverted component over the component mounting target site on the substrate can be set shortly and therefore, mounting accuracy of the component can be improved while achieving downsizing of the whole component mounting apparatus by shortening a downward movement stroke of the component at the time when the mounting head mounts the component on the substrate.

BRIEF DESCRIPTION OF THE DRAWINGS

FIG. 1 is view in which (a) is a plan view of a component mounting apparatus in one embodiment of the invention and (b) is a side view thereof.

FIG. 2 is view in which (a) is a plan view of an inverting head in one embodiment of the invention, (b) is a front view thereof and (c) is a side view thereof.

FIG. 5 is view in which (a) is a perspective view of a nozzle holder constructing the inverting head in one embodiment of the invention and (b) is an exploded perspective view thereof.

FIG. 6 is view in which (a) is a sectional side view of the nozzle holder in one embodiment of the invention and (b) is an exploded sectional side view thereof.

FIG. 7 is view in which (a) and (b) are side views of the nozzle holder in one embodiment of the invention.

FIG. 8 is view in which (a) and (b) are plan views of the inverting head in one embodiment of the invention.

FIG. 10 is view in which (a) and (b) are views showing a situation in which the inverting head of the component mounting apparatus in one embodiment of the invention passes a vertically inverted component to a mounting head.

MODE FOR CARRYING OUT THE INVENTIONS

Figure 1:
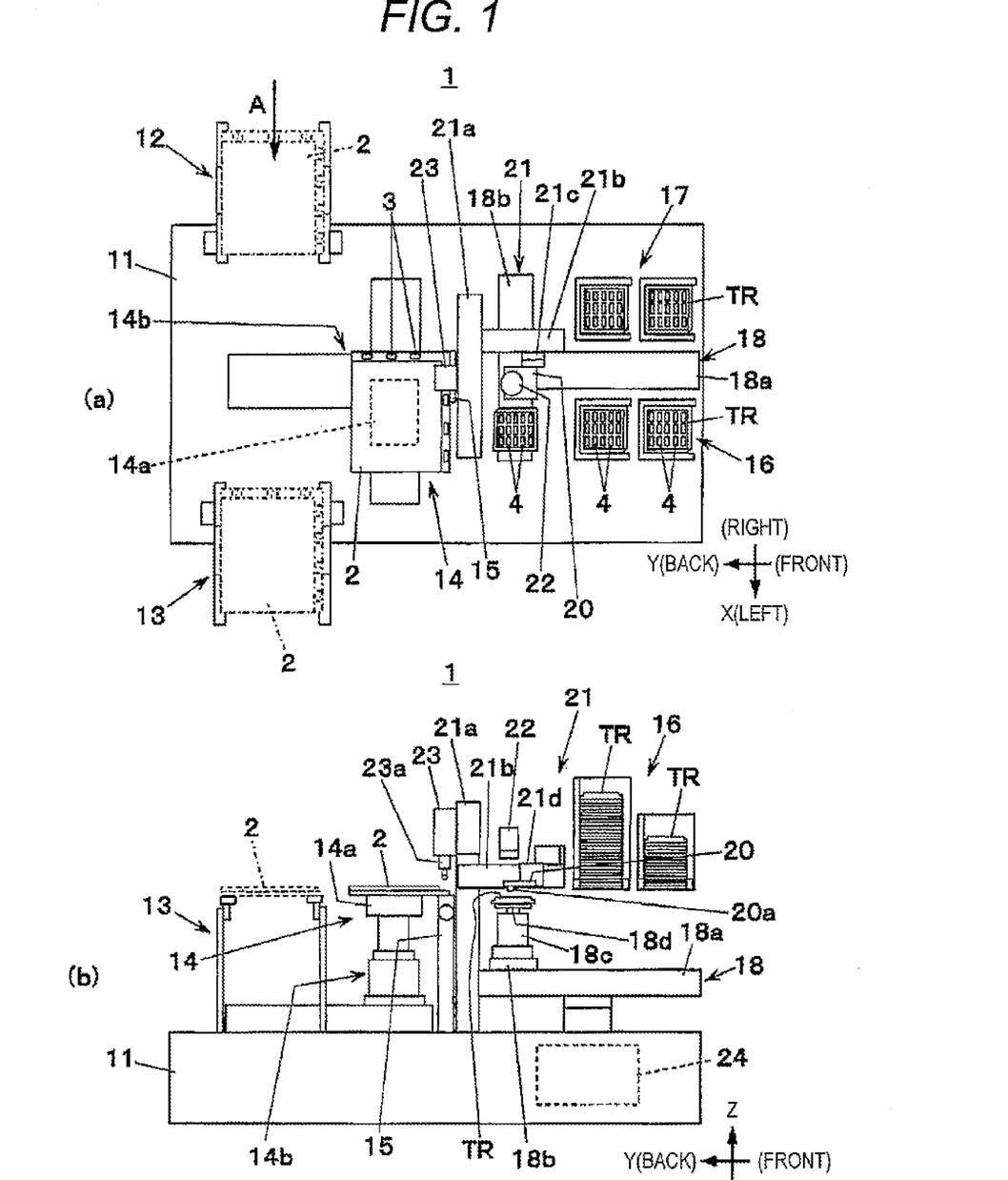

An embodiment of the invention will hereinafter be described with reference to the drawings. A component mounting apparatus 1 shown in (a) and (b) in FIG. 1 is an apparatus for repeatedly performing component mounting operation in which a substrate 2 fed from another apparatus adjacent to the upstream process side of this component mounting apparatus 1 is carried in and positioned and a component 4 is mounted on an electrode part 3 formed on the edge of the substrate 2 and is carried out to another apparatus adjacent to the downstream process side of the component mounting apparatus 1 and includes a substrate carry-in part 12, a substrate carry-out part 13, a substrate positioning part 14, a backup stage 15, a tray supply part 16, a tray recovery part 17, a tray movement mechanism 18, an inverting head 20, an inverting head movement mechanism 21, a recognition camera 22, a mounting head 23 and a controller 24 on a base 11. Hereinafter, for convenience of explanation, a direction (arrow A shown in (a) in FIG. 1) of conveyance of the substrate 2 is set in an X-axis direction, and a direction orthogonal to the X-axis direction in a horizontal plane is set in a Y-axis direction, and a vertical direction is set in a Z-axis direction. Also, using the Y-axis direction as front-back directions, the side (the right side of (a) and (b) in FIG. 1) in which an operator does work in the directions is set in the front and its opposite side (the left side of (a) and (b) in FIG. 1) is set in the back. Further, using the X-axis direction as right-and-left directions, the side (the right side when viewed from the operator, and the upper side in (a) in FIG. 1) in which an apparatus of the upstream process side is formed in the directions is set in the right, and the side (the left side when viewed from the operator, and the lower side in (a) in FIG. 1) in which an apparatus of the downstream process side is formed is set in the left.

In (a) in FIG. 1, both of the substrate carry-in part 12 and the substrate carry-out part 13 include conveyor mechanisms extending in the X-axis direction, and are formed oppositely in the X-axis direction in a region of the back on the base 11. In the present embodiment, the substrate carry-in part 12 is arranged in the right end of the base 11 and the substrate carry-out part 13 is arranged in the left end of the base 11.

The substrate positioning part 14 is formed in a region between the substrate carry-in part 12 and the substrate carry-out part 13 on the base 11, and includes a substrate holding table 14a for holding the substrate 2, and a substrate holding table driving part 14b for horizontally moving and upwardly and downwardly moving the substrate holding table 14a for holding the substrate 2. The backup stage 15 is formed so as to extend in the X-axis direction in a region of the front of the substrate positioning part 14 on the base 11.

The substrate positioning part 14 moves the substrate holding table 14a for holding the substrate 2 by the substrate holding table driving part 14b, and moves and positions the substrate 2. At this time, after a direction of the substrate 2 is aligned so as to arrange a line of the electrode parts 3 which are component mounting target sites formed on the edge of the substrate 2 in the X-axis direction, the line of the electrode parts 3 is positioned over the backup stage 15.

As shown in (a) in FIG. 1, in the embodiment, each of the edge of one long side and the edge of one short side is provided with the line of the electrode parts 3 by plural pieces. As a result, the substrate positioning part 14 operates so that the substrate 2 is positioned so as to position the line of the electrode parts 3 in the edge of one long side of the substrate 2 over the backup stage 15 and the component 4 in the one long side is mounted and then the substrate holding table 14a is rotated 90° and the substrate 2 is positioned so as to position the line of the electrode parts 3 in the edge of one short side of the substrate 2 over the backup stage 15.

In (a) and (b) in FIG. 1, the tray supply part 16 and the tray recovery part 17 respectively include plural tray stockers capable of vertically stacking and stocking plural trays TR and also taking the tray TR into and out of the lower side. The trays TR (before the components 4 are taken out) in which the components 4 are housed are stocked in the tray supply part 16, and the trays TR (after the components 4 are taken out) in which the components 4 are not housed are stocked in the tray recovery part 17.

In (a) and (b) in FIG. 1, the tray movement mechanism 18 includes a Y-axis table 18a formed so as to extend in a Y-axis direction in a region of the front of the base 11, an X-axis table 18b for moving in the Y-axis direction on the Y-axis table 18a so as to extend in an X-axis direction, a Z-axis table 18c capable of upwardly and downwardly moving a top plate part while moving in the X-axis direction on the X-axis table 18b, and a tray support part 18d attached to the top plate part of the Z-axis table 18c, and the tray support part 18d is provided with a tray grip mechanism (not shown) for taking the tray TR out of the tray supply part 16 and housing the tray TR in the tray recovery part 17. The tray movement mechanism 18 performs operation (supply operation of the component 4) in which the tray support part 18d is moved three-dimensionally by combining movement operation of the X-axis table 18b with respect to the Y-axis table 18a, movement operation of the Z-axis table 18c with respect to the X-axis table 18b and upward and downward movement operation of the top plate part of the Z-axis table 18c and the tray TR is taken out of the lower side of the tray supply part 16 and is moved in a predetermined component supply position (position in which the inverting head 20 described below sucks the component 4, (b) in FIG. 1), and operation in which the empty tray TR after the completion of takeout of the component 4 by the inverting head 20 in the component supply position is housed in the tray recovery part 17.

After the component 4 of the inside of the tray TR positioned in the component supply position by the tray movement mechanism 18 is sucked by a nozzle 20a and is taken out, the inverting head 20 vertically inverts the component 4 by switching a direction of the nozzle 20a between the lower side and the upper side. The inverting head 20 can swing the nozzle 20a of a state turned to the upper side or the lower side in a horizontal plane, and can align a direction of the vertically inverted component 4 in the horizontal plane (the details will be described below).

A gate-shaped stage 21a formed so as to extend in the X-axis direction is arranged in the center of the base 11, and the inverting head movement mechanism 21 includes a Y stage 21b extending in the Y-axis direction and movable in the X-axis direction on the lower side of the gate-shaped stage 21a, a Z stage 21c extending in the Z-axis direction and movable in the Y-axis direction on the Y stage 21b, and a movement base 21d formed upwardly and downwardly movably along the Z stage 21c. The inverting head 20 is attached to the movement base 21d, and the inverting head movement mechanism 21 moves the inverting head 20 by combining movement of the Z stage 21c in the Y-axis direction with respect to the Y stage 21b and upward and downward movement of the movement base 21d with respect to the Z stage 21b.

The recognition camera 22 is arranged so that an imaging visual field is turned downwardly and an imaging optical axis passes through the component supply position. The recognition camera 22 images the component 4 positioned in the component supply position or the component 4 sucked and vertically inverted from the component supply position by the inverting head 20 from the upper side.

The mounting head 23 is formed in an upward position of the backup stage 15 so as to be fixed (therefore, spatially fixed) to the gate-shaped stage 21a. The mounting head 23 upwardly and downwardly movably includes a component mounting part 23a with a nozzle shape extending downwardly, and the component 4 vertically inverted by the inverting head 20 and received by the component mounting part 23a is mounted on the electrode part 3 of the substrate 2 on the backup stage 15 by downward movement operation of the component mounting part 23a. Here, the mounting head 23 is fixed and formed over the backup stage 15, so that a mounting point of the component 4 is in a state substantially matching with the lowest point of a downward stroke of the component mounting part 23a included by the mounting head 23.

In addition, when the vertically inverted component 4 is passed to the mounting head 23, the inverting head 20 is moved from a front position of the mounting head 23 toward a horizontal direction (back) so as to enter the inside of a region between the mounting head 23 and the substrate 2 positioned by the substrate positioning part 14.

Figure 2:
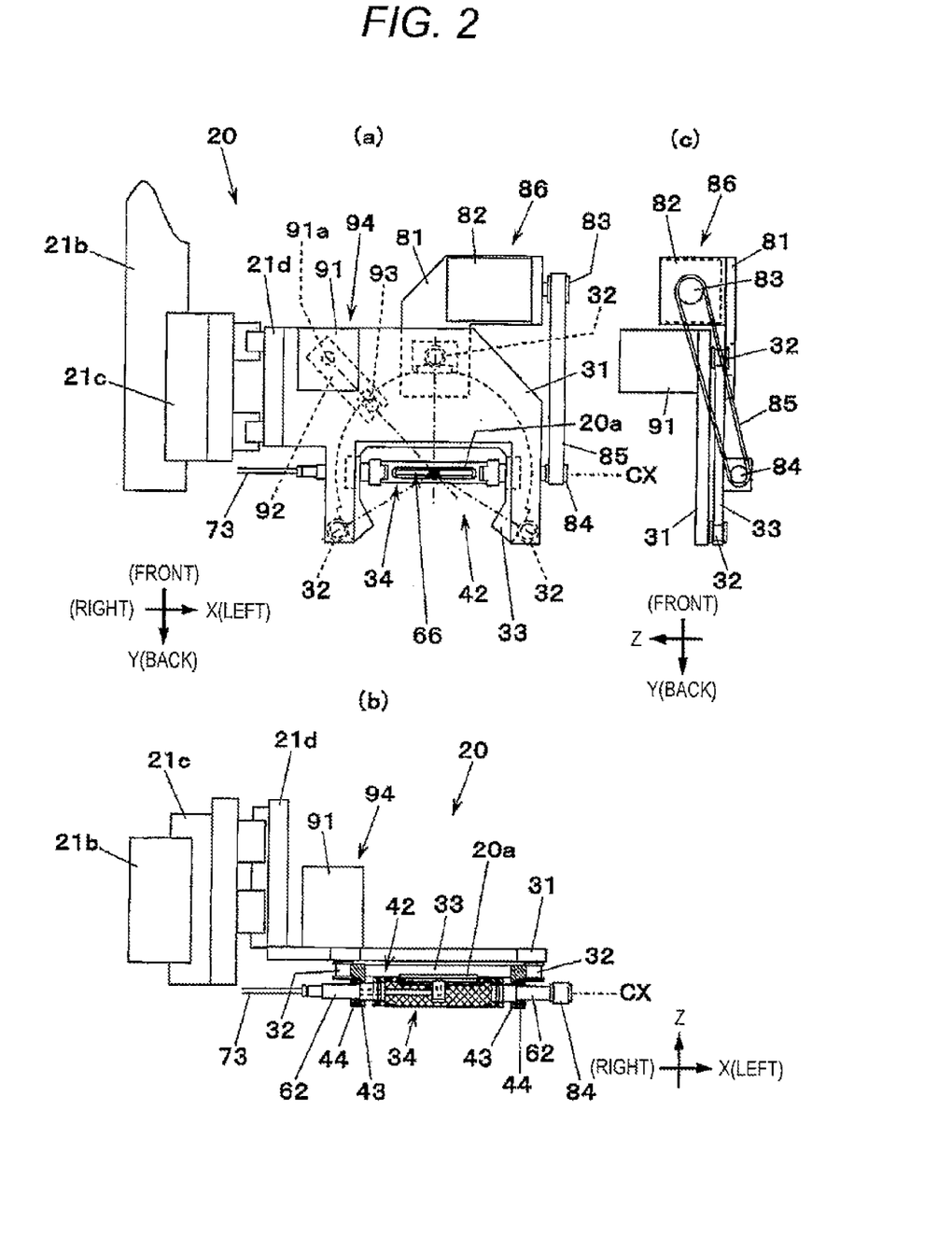

Next, a configuration of the inverting head 20 included by the component mounting apparatus 1 will be described. The inverting head 20 is configured to include a basal part 31 with a flat plate shape formed so as to laterally overhang to the movement base 21d upwardly and downwardly movable in the inverting head movement mechanism 21, plural bearings 32 formed on a lower surface of the basal part 31, a nozzle holder support member 33 formed swingably in the horizontal plane under the basal part 31, the nozzle holder support member 33 in which a part of the outer peripheral surface is supported by these plural bearings 32, and a nozzle holder 34 whose both ends are supported by the nozzle holder support member 33, the nozzle holder 34 which extends in a horizontal direction and is rotatable around the horizontal axis CX and also holds the nozzle 20a on a side surface as shown in (a), (b) and (c) in FIG. 2.

Figure 3:
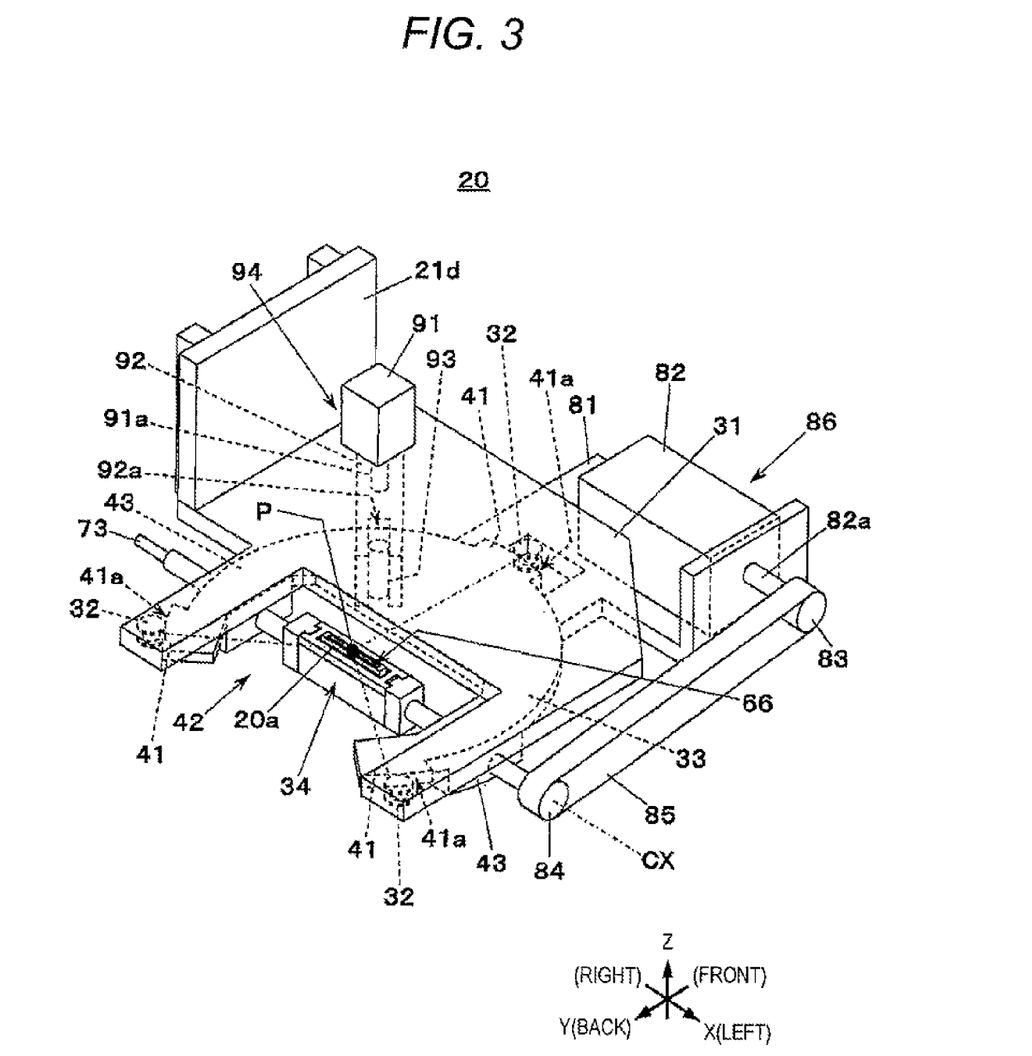
FIG. 3 is a perspective view of the inverting head included by the component mounting apparatus in one embodiment of the invention.
Figure 4:
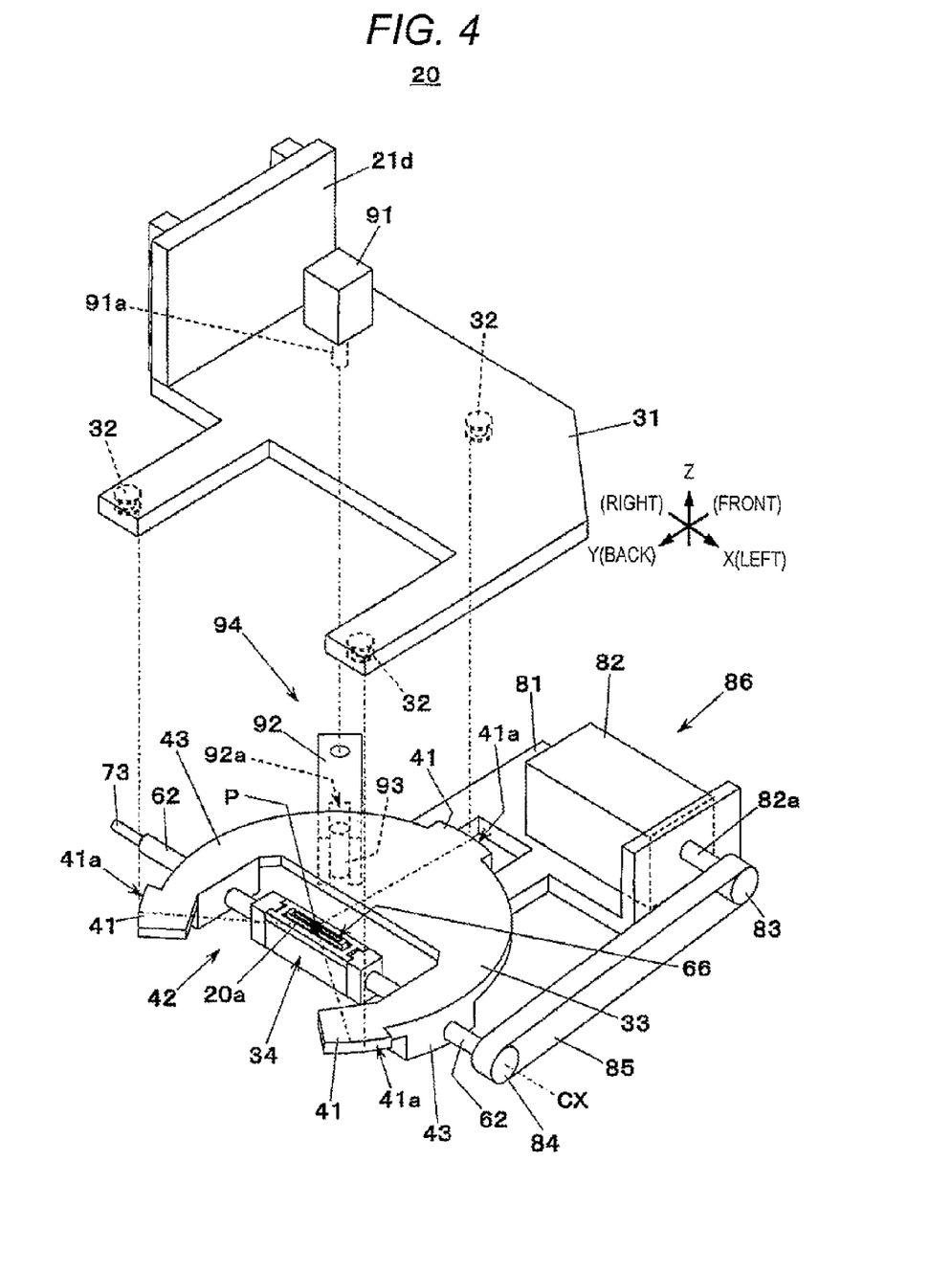
FIG. 4 is an exploded perspective view of the inverting head in one embodiment of the invention.

In FIGS. 3 and 4, the nozzle holder support member 33 is made of a member having a generally circular plate shape in plan view, and a part of the outer periphery of the nozzle holder support member 33 is provided with three projections 41 using a part of a circle around the swing center P set at the center of a circular plate as arcuate outer peripheral surfaces 41a. The plural bearings 32 formed on the lower surface of the basal part 31 circumscribe and support the arcuate outer peripheral surfaces 41a of the three projections 41 of the nozzle holder support member 33, and the nozzle holder support member 33 can swing in the horizontal plane with respect to the basal part 31 around the swing center P set at the center.

That is, the nozzle holder support member 33 is configured to be swingable in the horizontal plane with respect to the basal part 31 by supporting the arcuate outer peripheral surfaces 41a by the plural bearings 32 formed on the basal part 31.

Figure 5:
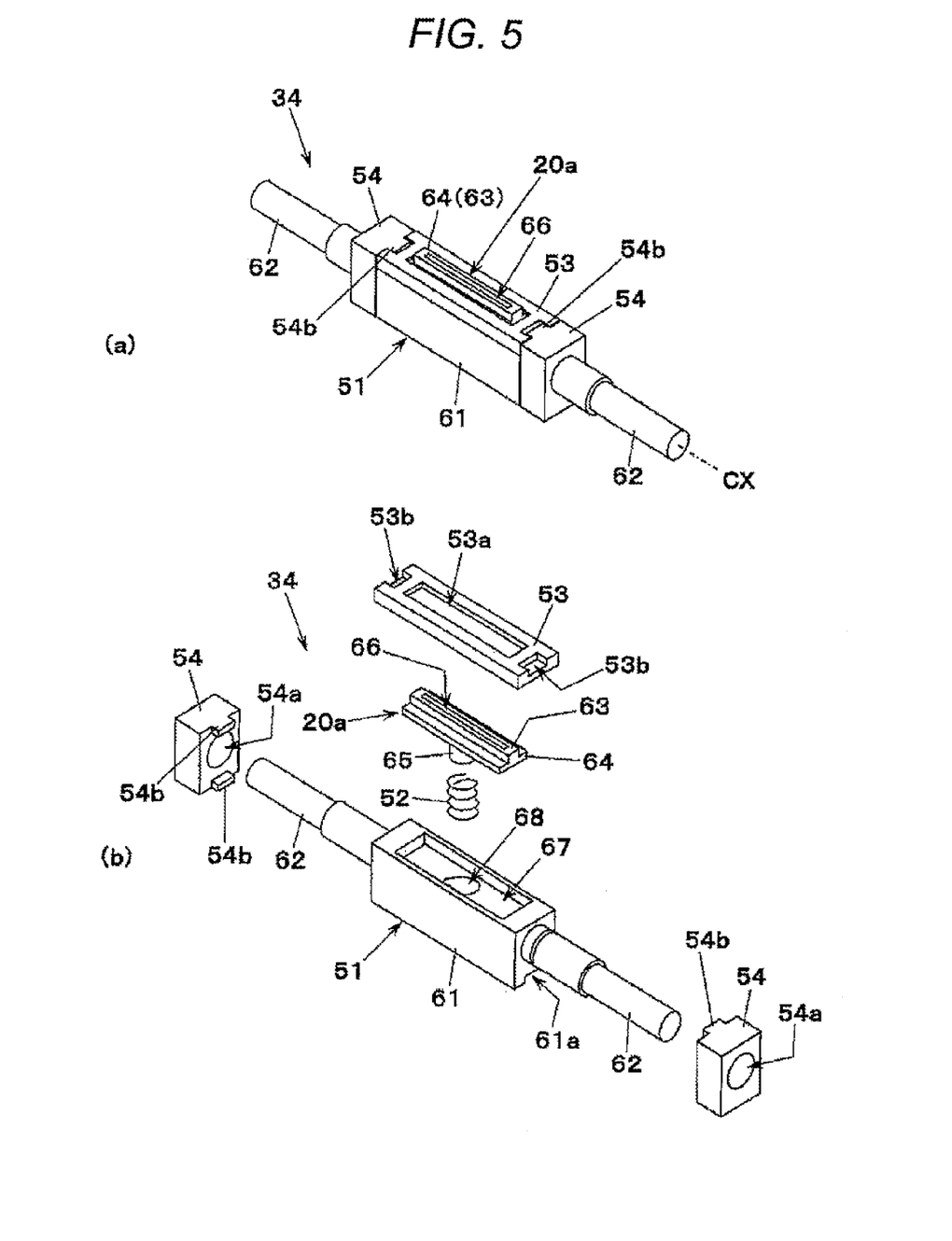
Figure 6:
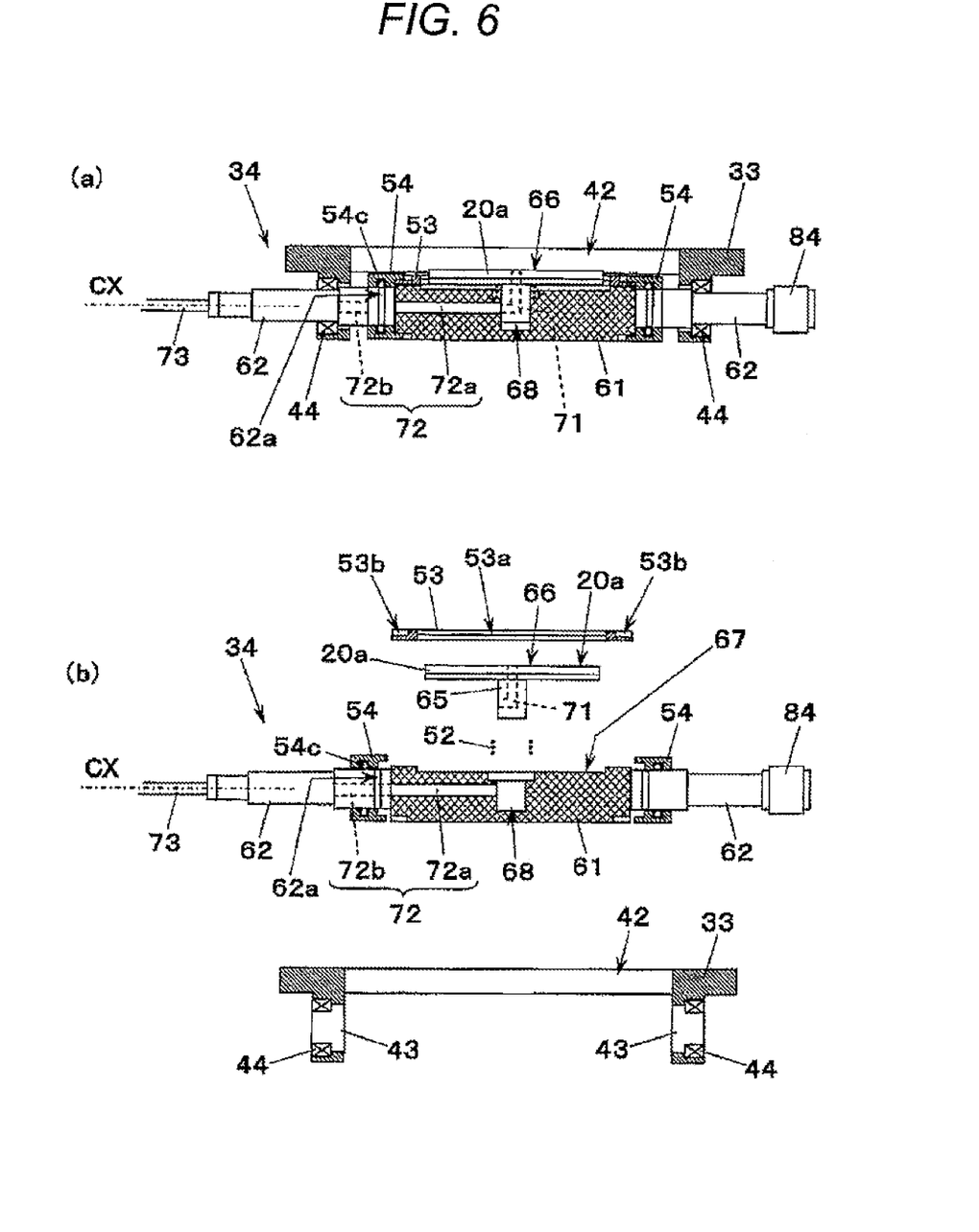
Figure 7:
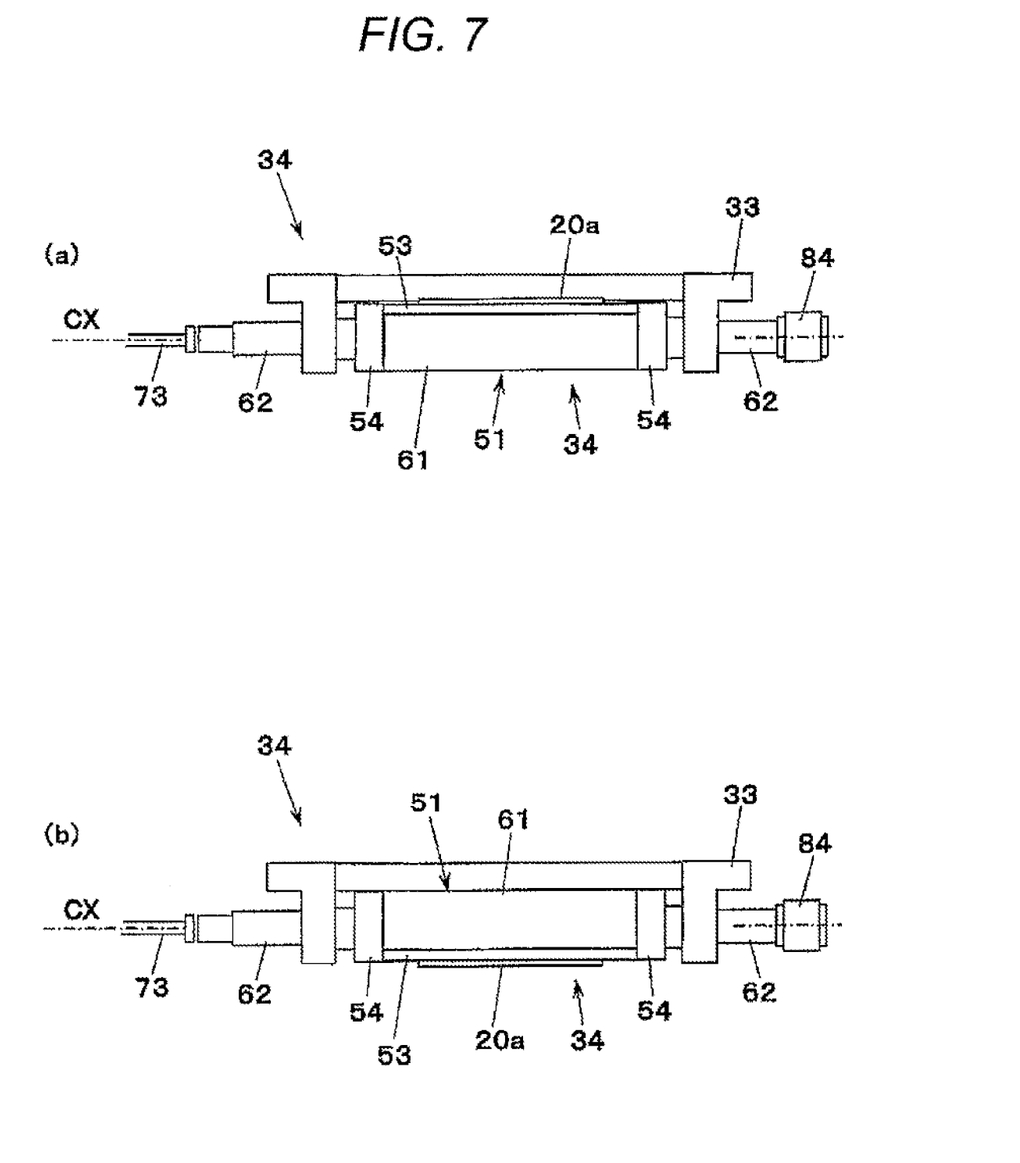

As shown in (a) and (b) in FIG. 5 and (a) and (b) in FIG. 6, the nozzle holder support member 33 is provided with a notch 42 in a central region including the swing center P described above, and both portions between which this notch 42 is sandwiched are formed in a pair of arm parts 43 extending in a direction in the horizontal plane. A pair of bearings 44 ((b) in FIG. 2) is built into the pair of arm parts 43, and both ends of the nozzle holder 34 are supported in a horizontal attitude by the pair of bearings 44.

That is, both ends of the nozzle holder 34 are supported by the nozzle holder support member 33, and the nozzle holder 34 is configured to extend so as to traverse in the horizontal direction in the notch 42 had by the nozzle holder support member 33 and be rotatable around the horizontal axis CX and also hold the nozzle 20a on the side surface.

In (a) and (b) in FIG. 5, the nozzle holder 34 is configured to include a nozzle base 51 extending in the horizontal direction, the nozzle base 51 whose both ends are rotatably supported by a pair of bearings 44 included by the nozzle holder support member 33, a compression spring member 52, a nozzle locking member 53, and a pair of fixing members 54. Further, the nozzle base 51 is configured to have a base body 61 with a rectangular parallelepiped shape extending in the horizontal direction, and two tubular base body support parts 62 formed so as to outwardly extend from both ends of the base body 61.

In (a) and (b) in FIG. 5, the nozzle 20a is configured to have a nozzle body part 64 having a protrusion 63 formed in a laterally long rectangular parallelepiped shape and also projecting toward the outside of the nozzle holder 34, and a cylindrical part 65 projecting and extending from the nozzle body part 64 toward the inside of the nozzle holder 34, and the nozzle body part 64 is provided with a component suction port 66 with a slit shape. The nozzle locking member 53 is made of a rectangular member with a laterally long flat plate shape, and is configured to have an opening 53a with dimensions in which the protrusion 63 of the nozzle 20a can extend through the opening 53a.

In (b) in FIG. 5 and (b) in FIG. 6, one side surface of the base body 61 is provided with a rectangular recess 67 and a cylindrical recess 68 positioned inside the rectangular recess 67. The cylindrical part 65 of the nozzle 20a is received inside the cylindrical recess 68, and the nozzle body part 64 of a state in which the protrusion 63 of the nozzle 20a whose cylindrical part 65 is received in the cylindrical recess 68 extends through the opening 53a is received in the rectangular recess 67. Each of the fixing members 54 has a through hole 54a through which both ends (base body support parts 62) of the nozzle base 51 extend and also, both vertical ends between which the through hole 54a is sandwiched are provided with a pair of pawl parts 54b.

The fixing members 54 are slid and mounted on both ends of the nozzle base 51 from the outsides of both ends of the nozzle base 51 after the nozzle locking member 53 is attached to the base body 61 so that the cylindrical part 65, inserted into the compression spring member 52, of the nozzle 20a is received inside the cylindrical recess 68 and the protrusion 63 of the nozzle 20a extends through the opening 53a of the nozzle locking member 53. At this time, a pair of pawl parts 54b of each of the fixing members 54 engages with a locking recess 53b ((b) in FIG. 5) of the end of the nozzle locking member 53 and a locking recess 61a ((b) in FIG. 5) of the end of the base body 61, and the nozzle locking member 53 is coupled to the nozzle base 51. At this time, a groove part 62a formed in the base body support part 62 engages with an O ring 54e formed in an inner surface of the through hole 54a and thereby, each of the fixing members 54 is fixed to the nozzle base 51 ((b) in FIG. 6→(a) in FIG. 6), and the nozzle 20a becomes attached to the nozzle base 51 ((a) in FIG. 5).

In (a) and (b) in FIG. 6, the inside of the nozzle 20a is provided with a vacuum path 71 of the inside of the nozzle in which one end is opened to component suction port 66 and the other end is opened to a side surface of the cylindrical part 65. Also, the inside of the nozzle base 51 is provided with a vacuum path 72 of the inside of the nozzle base. This vacuum path 72 of the inside of the nozzle base includes a first vacuum path 72a of the inside of the nozzle base formed inside the base body 61, the first vacuum path 72a in which one end is opened to the inside of the cylindrical recess 68, and a second vacuum path 72b of the inside of the nozzle base formed inside one base body support part 62 and joined to the first vacuum path 72a of the inside of the nozzle base.

In a state in which the nozzle 20a is attached to the nozzle base 51, the vacuum path 71 of the inside of the nozzle communicates with the vacuum path 72 of the inside of the nozzle base ((a) in FIG. 6). A vacuum supply pipeline 73 extending from a vacuum supply device (not shown) is connected to the side (the left base body support part 62 in (a) and (b) in FIG. 6) provided with the second vacuum path 72b of the inside of the nozzle base in the two base body support parts 62 included by the nozzle base 51. As a result, in the state in which the nozzle 20a is attached to the nozzle base 51, the nozzle 20a is joined to the vacuum supply pipeline 73 through the vacuum path 71 of the inside of the nozzle and the vacuum path 72 of the inside of the nozzle base and a vacuum is supplied from the vacuum supply device to the vacuum supply pipeline 73 and thereby, the vacuum can be generated inside the vacuum path 71 of the inside of the nozzle to suck the component 4 by the nozzle 20a.

Thus, the nozzle holder 34 of the inverting head 20 included by the component mounting apparatus 1 in the embodiment is configured to include the nozzle base 51 whose both ends are supported by the nozzle holder support member 33, the nozzle base 51 inside which the vacuum path (the vacuum path 72 of the inside of the nozzle base) is formed, extending in the horizontal direction, the nozzle locking member 53 for locking the nozzle 20a in a side surface of the nozzle base 51 and communicating the nozzle 20a (the vacuum path 71 of the inside of the nozzle) to the vacuum path 72 of the inside of the nozzle base, and a pair of fixing members 54 which is slid and mounted on both ends of the nozzle base 51 from the outsides of both ends of the nozzle base 51 and fixes the nozzle locking member 53 to the nozzle base 51. Thus, the nozzle locking member 53 is configured to be fixed to the nozzle base 51 by a pair of fixing members 54 mounted on both ends of the nozzle base 51 from the outsides of both ends of the nozzle base 51, so that attachment of the nozzle locking member 53 to the nozzle base 51 does not require a screw.

In (a) and (c) in FIG. 2, and FIGS. 3 and 4, a front position of the nozzle holder support member 33 is provided with a bracket 81 extending to the front, and an inverting motor 82 is attached to an upper surface of this bracket 81. A driving pulley 83 is attached to a driving shaft 82a of the inverting motor 82, and a driven pulley 84 is attached to the base body support part 62 of one side (the side opposite to the side provided with the second vacuum path 72b of the inside of the nozzle base described above) had by the nozzle holder 34. A transmission belt 85 is looped between the driving pulley 83 and the driven pulley 84 and when the driving shaft 82a of the inverting motor 82 is rotated, the nozzle holder 34 rotates around the horizontal axis CX through the driving pulley 83, the transmission belt 85 and the driven pulley 84. Accordingly, a direction of the nozzle 20a is vertically switched ((a) in FIG. 7→(b) in FIG. 7, or (b) in FIG. 7→(a) in FIG. 7).

In the embodiment thus, a mechanism including the inverting motor 82, the driving pulley 83, the driven pulley 84 and the transmission belt 85 forms a rotation driving part 86 for rotating the nozzle holder 34 around the horizontal axis CX and vertically switching a direction of the nozzle 20a.

In (a), (b), and (c) in FIG. 2, FIGS. 3 and 4, an upper surface of the basal part 31 is provided with a swing motor 91. A driving shaft 91a of this swing motor 91 downwardly extends through the basal part 31 in a thickness direction, and one end of a swing driving arm 92 positioned in the lower surface side of the nozzle holder support member 33 and extending in the horizontal direction is attached to the top of the driving shaft 91a. The other end side of the swing driving arm 92 is provided with a groove part 92a extending in a vertical direction, and this groove part 92a engages with a pin member 93 formed so as to downwardly extend from a lower surface of the nozzle holder support member 33. As a result, when the driving shaft 91a of the swing motor 91 rotates, the swing driving arm 92 swings around the driving shaft 91a and therefore, the nozzle holder support member 33 swings in the horizontal plane around the swing center P through the pin member 93 engaging with the groove part 92a of the end of the swing driving arm 92 ((a) in FIG. 8→(b) in FIG. 8).

Figure 8:
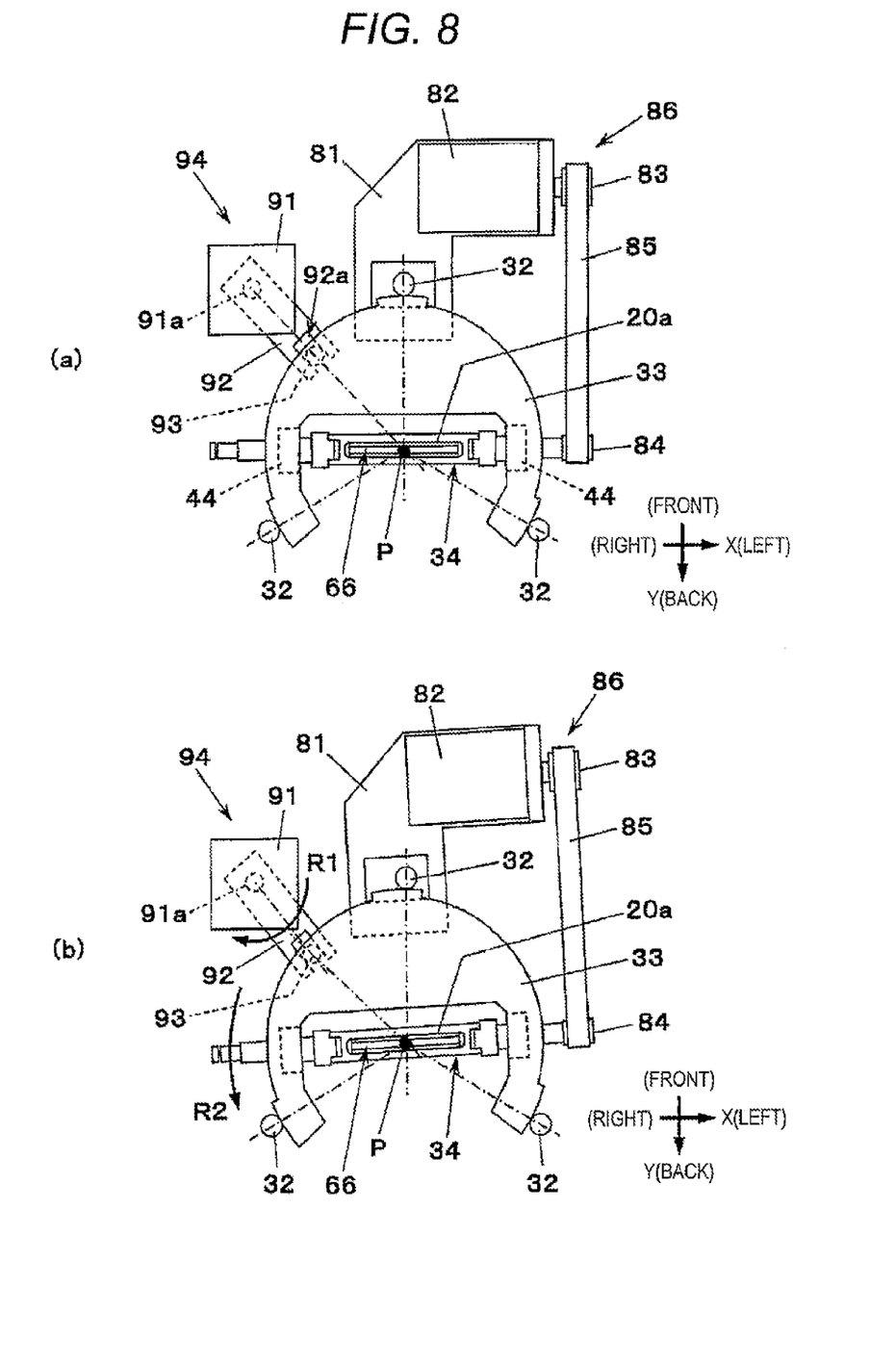

A center position of the nozzle 20a in a state in which the nozzle 20a is turned to the upward side or the downward side matches with a position of the swing center P of the nozzle holder support member 33 in plan view, and the nozzle holder support member 33 is swung in the horizontal plane and thereby, a direction of the nozzle 20a turned to the upward side or the downward side in the horizontal plane can be changed. (b) in FIG. 8 shows an example of the case of swinging the nozzle holder support member 33 in a counterclockwise direction in plan view (arrow R2) by actuating the swing motor 91 from a state of (a) in FIG. 8 and swinging the swing driving arm 92 in a clockwise direction in plan view (arrow R1).

In the embodiment thus, the swing motor 91, the swing driving arm 92 and the pin member 93 form a swing driving part 94 for swinging the nozzle holder support member 33 in the horizontal plane with respect to the basal part 31 and changing the direction of the nozzle 20*a* turned to the upward side or the downward side in the horizontal plane.

Figure 9:
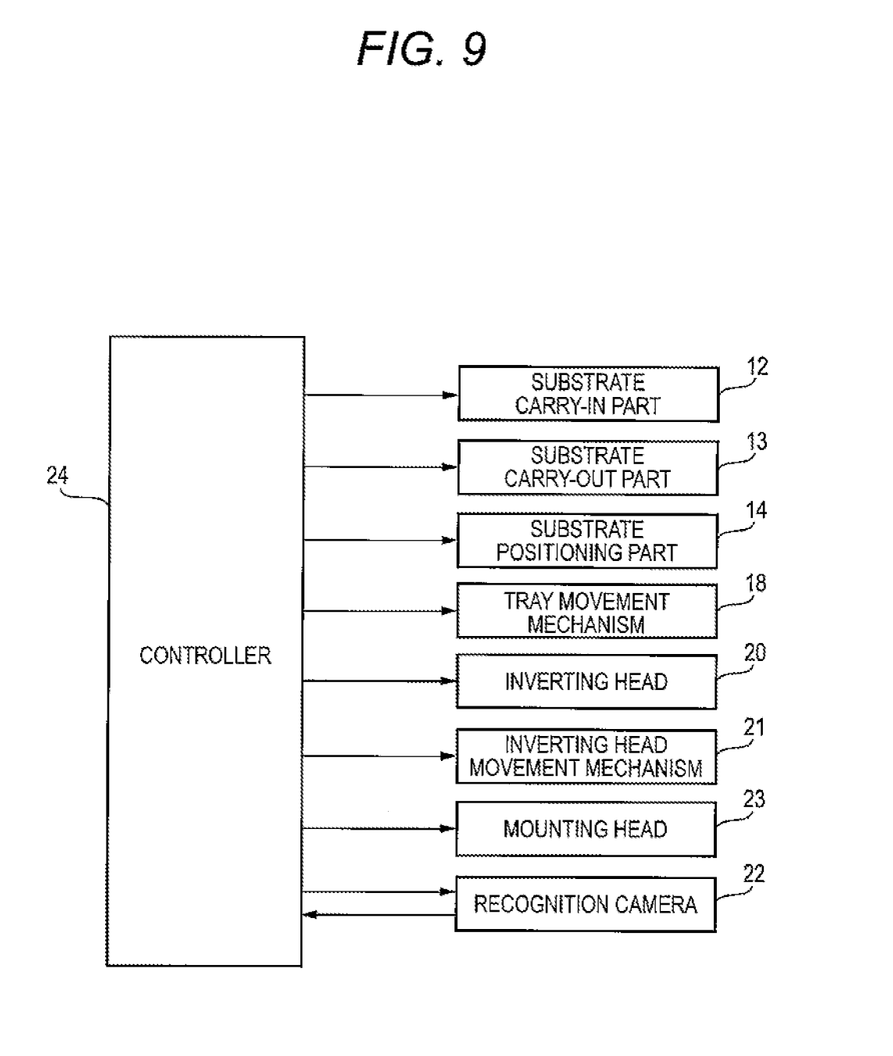
FIG. 9 is a block diagram showing a control system of the component mounting apparatus in one embodiment of the invention.

In the component mounting apparatus 1 configured thus, actuation control of the substrate carry-in part 12, the substrate carry-out part 13, the substrate positioning part 14, the tray movement mechanism 18, the inverting head 20, the inverting head movement mechanism 21 and the mounting head 23 is performed by the controller 24. Also, image recognition control based on the obtained image data and imaging operation control by the recognition camera 22 are performed by the controller 24 (FIG. 9).

When the controller 24 detects that the substrate 2 is fed from another apparatus adjacent to the upstream process side of the component mounting apparatus 1 to the substrate carry-in part 12, the controller 24 performs actuation control of the substrate carry-in part 12 and the substrate positioning part 14, and transfers the substrate 2 from the substrate carry-in part 12 to the substrate positioning part 14.

When the substrate 2 is transferred from the substrate carry-in part 12 to the substrate positioning part 14, the controller 24 performs actuation control of the substrate positioning part 14, and moves the substrate 2 in the horizontal plane, and positions the substrate 2 so that a line of the electrode parts 3 in one long side of the substrate 2 is arranged and positioned in the X-axis direction over the backup stage 15. At this time, the electrode part 3 corresponding to a component mounting target site at which the component 4 attempts to be mounted from now is positioned at a mounting point of the component 4 just under the mounting head 23.

When the substrate 2 is positioned, the controller 24 performs actuation control of the tray movement mechanism 18, and takes the tray TR out of the tray supply part 16 and positions the tray TR taken out in a component supply position.

When the tray TR is positioned in the component supply position, the controller 24 performs actuation control of the inverting head movement mechanism 21, and moves the inverting head 20 in a state in which the nozzle 20*a* is turned to the downward side to the upward side of the tray supply part 16. Then, the actuation control of the inverting head movement mechanism 21 is performed and the movement base 21*d* is downwardly moved, and the nozzle 20*a* of the inverting head 20 is brought into contact with the component 4 on the tray TR supplied in the component supply position from above and the component 4 is sucked by the nozzle 20*a* and is taken out (picked up).

When the component 4 is sucked by the inverting head 20 and is taken out of the tray TR, the controller 24 performs actuation control of the rotation driving part 86, and switches a direction of the nozzle 20*a* from the downward side to the upward side, and vertically inverts the component 4. Then, the vertically inverted component 4 is imaged by the recognition camera 22 and an image is recognized, and the amount of positional deviation of a center position of the vertically inverted component 4 from a reference position is detected. In addition, the image of the component 4 is herein recognized in a state in which the component 4 is vertically inverted by the inverting head 20, but before the inverting head 20 takes the component 4 out of the tray TR positioned in the component supply position by the tray movement mechanism 18, its component 4 may be imaged by the recognition camera 22 to recognize the image.

Figure 10:
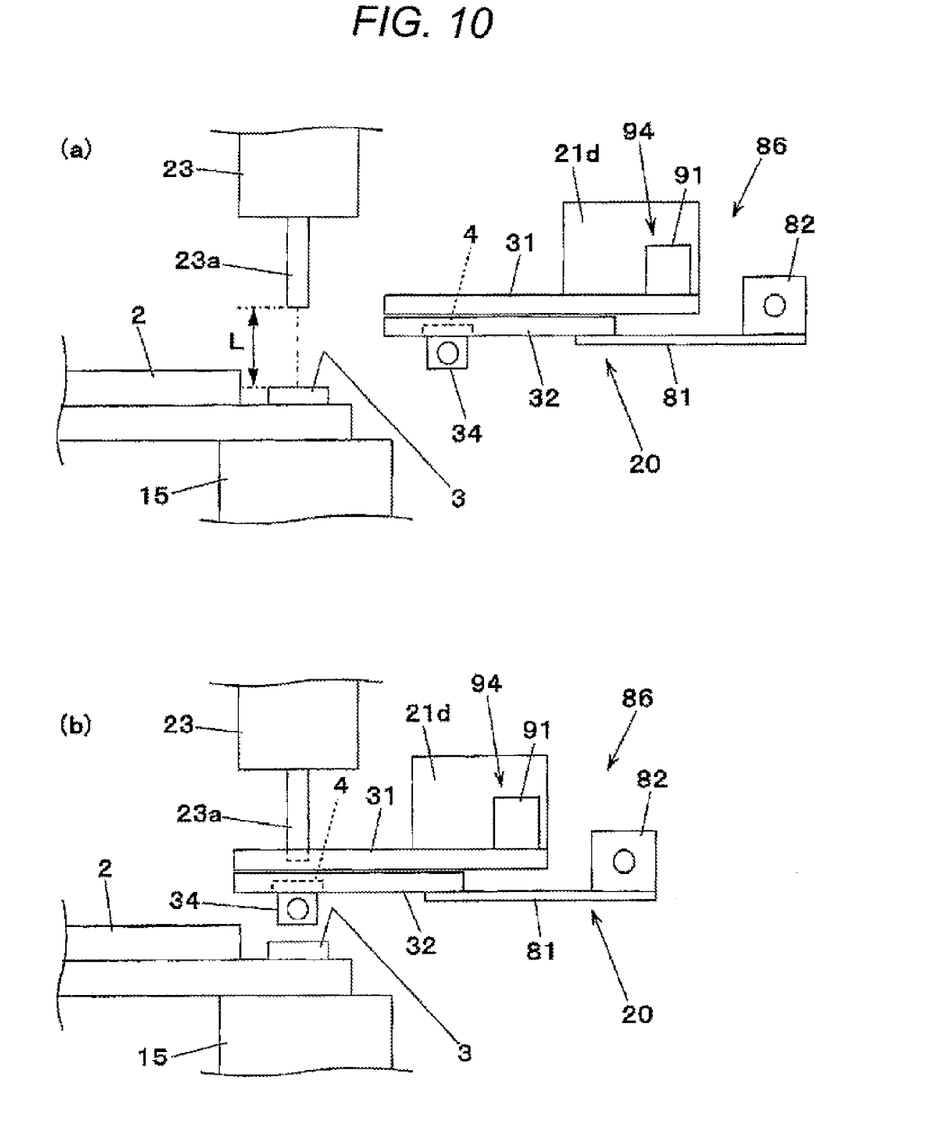

When the amount of positional deviation of the component 4 vertically inverted by the inverting head 20 from the reference position is detected, the controller 24 moves the inverting head 20 so as to position the component 4 over the electrode part 3 (under the mounting head 23) which is the component mounting target site on the substrate 2 ((a) in FIG. 10→(b) in FIG. 10). At this time, a movement position of the inverting head 20 is determined so as to cancel the positional deviation of the component 4 from the reference position of the electrode part 3 detected through imaging by the recognition camera 22 and also, actuation control of the swing driving part 94 is performed and a direction of the nozzle 20*a* in the horizontal plane is changed into a normal direction.

In a process in which the inverting head 20 is moved so as to position this inverted component 4 over the electrode part 3 (under the mounting head 23), the inverting head 20 does not have a mechanism for upwardly and downwardly moving the nozzle holder 34 (a mechanism for upwardly and downwardly moving the movement base 21*d* herein) and a mechanism for swinging around the vertical axis (the swing driving part 94 herein) in a vertical region of the nozzle holder 34, and the vertical region of the nozzle holder 34 is in an opened state, so that a distance L ((a) in FIG. 10) between the substrate 2 and the mounting head 23 necessary to prevent the inverting head 20 from interfering with both of the substrate 2 and the mounting head 23 in the case of moving the vertically inverted component 4 over the electrode part 3 which is the component mounting target site on the substrate 2 has only to be about a distance in which a moderate clearance is added to a thickness of the nozzle holder 34.

When the component 4 is positioned over the electrode part 3 which is the component mounting target site on the substrate 2, the controller 24 performs actuation control of the inverting head movement mechanism 21, and upwardly moves the inverting head 20, and brings the component 4 sucked by the nozzle 20*a* into contact with the component mounting part 23*a* of the mounting head 23 from below (or, downwardly moves the component mounting part 23*a* of the mounting head 23 and brings the component mounting part 23*a* into contact with the component 4 sucked by the nozzle 20*a* from above), and passes the component 4 from the inverting head 20 to the mounting head 23.

When the component 4 is passed from the inverting head 20 to the mounting head 23, the controller 24 performs actuation control of the inverting head movement mechanism 21, and forwardly moves the inverting head 20, and retracts the nozzle holder 34 from a region between the substrate 2 and the mounting head 23. Then, when the nozzle holder 34 is retracted from the region between the substrate 2 and the mounting head 23, the controller 24 downwardly moves the component mounting part 23*a* of the mounting head 23, and pushes the component 4 sucked by the component mounting part 23*a* on the electrode part 3 which is the component mounting target site on the substrate 2 from above and mounts the component 4.

In the component mounting apparatus 1 in the embodiment thus, the inverting head 20 is configured to have a function in which the component 4 supplied in the component supply position is sucked by the nozzle 20*a* from above and is vertically inverted and the vertically inverted component 4 is moved over the component mounting target site (the electrode part 3) on the substrate 2 positioned by the substrate positioning part 14. Also, the mounting head 23 is configured to have a function in which the component 4 moved over the component mounting target site is received from the inverting head 20 and the inverting head 20 retracts from the upward side of the component mounting target site and thereafter the component 4 is downwardly moved and is mounted at the component mounting target site.

When the component 4 is mounted on the electrode part 3 which is the component mounting target site on the substrate 2 as described above, the controller 24 moves the substrate 2 so that an electrode part 3 which is a new component mounting target site is positioned at the mounting point of the component 4 (under the mounting head 23) after the component mounting part 23a of the mounting head 23 is upwardly moved. Then, after the next component 4 is sucked (picked up) by the inverting head 20, the component 4 is mounted on the electrode part 3 which is the new component mounting target site.

When mounting of the component 4 on the electrode part 3 of one long side is completed in this manner, the controller 24 performs actuation control of the substrate positioning part 14, and rotates the substrate 2 90° and thereafter, mounts the component 4 on the electrode part 3 of one short side by a similar procedure. Then, when mounting of the component 4 on the electrode part 3 of one short side is completed, actuation control of the substrate positioning part 14 is performed, and the substrate 2 in which mounting of the component 4 is completed is passed to the substrate carry-out part 13 and then, actuation control of the substrate carry-out part 13 is performed and the substrate 2 is carried out to another apparatus adjacent to the downstream process side.

As described above, the inverting head 20 of the component mounting apparatus 1 in the embodiment has a configuration in which the nozzle locking member 53 for locking the nozzle 20a in a side surface of the nozzle base 51 and communicating the nozzle 20a to the vacuum path (the vacuum path 72 of the inside of the nozzle base) of the inside of the nozzle base 51 is fixed to the nozzle base 51 by a pair of fixing members 54 mounted on both ends of the nozzle base 51 from the outsides of both ends of the nozzle base 51, and attachment of the nozzle locking member 53 to the nozzle base 51 does not require a screw, so that it is unnecessary to consider the dimensions necessary to screw the screw. Accordingly, the dimension of the nozzle base 51 in a height direction can be decreased, so that the distance L between the substrate 2 and the mounting head 23 necessary to prevent the inverting head 20 from interfering with both of the substrate 2 and the mounting head 23 in the case of moving the vertically inverted component 4 over the component mounting target site (the electrode part 3) on the substrate 2 can be set shortly and therefore, a downward movement stroke of the component 4 at the time when the mounting head 23 mounts the component 4 on the substrate 2 is shortened and mounting accuracy of the component 4 can be improved.

The present application is based on Japanese patent application (patent application No. 2011-244232) filed on Nov. 8, 2011, and the contents of the patent application are hereby incorporated by reference.

INDUSTRIAL APPLICABILITY

An inverting head capable of improving mounting accuracy of a component while achieving downsizing of the whole component mounting apparatus by shortening a downward movement stroke of the component at the time when a mounting head mounts the component on a substrate in the component mounting apparatus is provided.

DESCRIPTION OF REFERENCE NUMERALS AND SIGNS

1 COMPONENT MOUNTING APPARATUS
2 SUBSTRATE
3 ELECTRODE PART (COMPONENT MOUNTING TARGET SITE)
4 COMPONENT
20 INVERTING HEAD
20a NOZZLE
23 MOUNTING HEAD
34 NOZZLE HOLDER
51 NOZZLE BASE
53 NOZZLE LOCKING MEMBER
54 FIXING MEMBER
72 VACUUM PATH OF INSIDE OF NOZZLE BASE (VACUUM PATH)
86 ROTATION DRIVING PART
CX HORIZONTAL AXIS

The invention claimed is:

1. An inverting head which is included in a component mounting apparatus configured for mounting a component on a substrate by a mounting head and sucks the component supplied in a component supply position from above by a nozzle and vertically inverts the component and moves the vertically inverted component over a component mounting target site on the substrate and passes the component to the mounting head, the inverting head comprising:
a nozzle holder whose both ends are supported, the nozzle holder which extends in a horizontal direction and is rotatable around a horizontal axis and also holds the nozzle which extends in the horizontal direction along the nozzle holder on a longitudinal side surface of the nozzle holder;
a nozzle holder support member having a substantially circular plate shape; and
a rotation driving part for rotating the nozzle holder around the horizontal axis and vertically switching a direction of the nozzle;
wherein the nozzle holder includes a nozzle base whose both ends are supported, the nozzle base inside which a vacuum path is formed, extending in the horizontal direction, a nozzle locking member for locking the nozzle in the side surface of the nozzle base and communicating the nozzle to the vacuum path of the inside of the nozzle base, and a pair of fixing members which is slid and mounted on both ends of the nozzle base from the outsides of both ends of the nozzle base and fixes the nozzle locking member to the nozzle base,
wherein each of the pair of fixing members includes a through hole and a pair of pawl parts, the through hole is disposed between the pair of pawl parts, and both ends of the nozzle base extend through the through holes, and
wherein the nozzle holder support member is provided with a notch in a central region of the nozzle holder support member, and a pair of arm parts sandwiching the notch and extending in a horizontal plane.

2. The inverting head according to claim 1, wherein an opening of the nozzle is disposed in parallel to the horizontal axis of the nozzle holder.

3. The inverting head according to claim 1, wherein each of the pair of arm parts supports each ends of the nozzle holder.

* * * * *